United States Patent [19]

Glavish et al.

[11] Patent Number: 4,916,322

[45] Date of Patent: Apr. 10, 1990

[54] ARRANGEMENT FOR STABILIZING AN IRRADIATED MASK

[75] Inventors: Hilton F. Glavish, Salem, Mass.; Hans Loschner, Vienna, Austria; Gerhard Stengel, Karnten, Austria; Alfred Chalupka, Vienna, Austria

[73] Assignees: Osterreichische Investitionskredit Aktiengesellschaft; IMS Ionen Mikrofabrikations Systeme Gesellschaft, both of Austria

[21] Appl. No.: 243,815

[22] Filed: Sep. 13, 1988

[30] Foreign Application Priority Data

Jan. 22, 1988 [AT] Austria .................................. 118/88

[51] Int. Cl.$^4$ ........................................... H01J 37/317
[52] U.S. Cl. .................................... 250/492.2; 378/34; 355/30
[58] Field of Search ............. 250/443.1, 492.21, 492.2; 378/34; 355/30

[56] References Cited

FOREIGN PATENT DOCUMENTS 58-15232 1/1983 Japan ............................... 250/492.2

OTHER PUBLICATIONS

Parry, J. Vac. Sci. Techol., vol. 13, No. 2, Mar./Apr. 1976, pp. 622–629.

*Primary Examiner*—Jack I. Berman
*Attorney, Agent, or Firm*—John N. Williams

[57] ABSTRACT

A system for stabilizing an irradiated mask for use in lithographic set-ups, the mask including formations which are permeable to electromagnetic or corpuscular radiations, especially ion beams, the system having one or more cooling surfaces that surround the beam axis, are disposed in the field of view of the mask, and are located between the mask and the radiation source and/or behind the mask. The cooling surfaces preferably are in the form of surfaces of revolutions, are comprised of metal, have grooves that produce multiple reflections of the thermal radiation and are spaced equal distances apart from the axis of the optical path. The distances from the cooling surfaces to the axis of the optical path preferably exceed the distance from the edge of the mask sheet to the axis of the optical path. The mask is disposed in a chamber which is maintained by automatic control at a constant temperature, particularly at room temperature, e.g. by heating of the walls. The mask sheet is movable in the chamber to extend in front of an opening that is formed in a chamber wall and disposed in the optical path; the opening optionally being formed in a shutter which constitutes a part of the chamber wall, and the cooling surfaces are disposed in the field of view of the mask when the latter is disposed in front of the opening in the optical path, so that the heating action of the beam of radiation on the mask can be compensated by the cooling surfaces and the mask will be maintained approximately at the chamber temperature also during an irradiation.

26 Claims, 9 Drawing Sheets

ARRANGEMENT FOR STABILIZING AN IRRADIATED MASK

FIELD OF THE INVENTION

This application is a continuation-in-part from U.S. application Ser. No. 201,959, filed June 2, 1988, and entitled "Method and Apparatus for Image Alignment in Ion Lithography", the contents of which are hereby incorporated by reference. This application claims priority from Austrian patent application Ser. No. 118/88 filed Jan. 22, 1988, entitled "Arrangement for Stabilizing an irradiated Mask".

This invention relates to an arrangement for stabilizing an irradiated mask for use in lithographic set-ups which mask comprises structures which are permeable to electromagnetic or corpuscular radiation.

The methods of making substantially stress-free mask sheets, which are subjected in use to relatively high thermal stresses and under such stresses must remain planar and free from distortion within tolerable limits presently give rise to problems in microfabrication systems.

In former patent applications (Austria No. A 3310-/85, EP-0223770, U.S. application Ser. No. 06/930,806, Japan No. 61-270821 and Austria No. A 3311/85 EP-0222737, U.S. patent application Ser. No. 06/930,805 (now U.S. Pat. No. 4,775,797), Japan No. 61-270822), methods have been described in which the stabilization of the mask sheet is effected by a thermal pretensioning of the mask sheet or by a heating of an associated frame.

If a thermally pretensioned mask sheet is loaded by the image-forming medium, i.e., by an electron beam or ion beam or the like, the position of the structures in the mask sheets will remain virtually unchanged within a load range which depends on the amount of the temperature change because the irradiation load merely decreases the thermally induced initial tension. But the position and the shape of the initially tensioned mask will be changed relative to the position and shape of the unstressed mask. Whereas the mask sheet will remain planar during the operation where that method is adopted, the latter has the disadvantage that the dimensions of the mask sheet and the locations of the mask structures will be changed by the initial tension. For that reason that method can be used only with test masks. Besides, the initial tension will not be sufficient if a mask sheet under a thermally induced initial tension is subjected to such a high irradiation load that the thermally induced initial tension is entirely used up. A thermally induced initial tension is permissible only within the elastic range.

Where frame heating is employed, the frame which holds the mask sheet is heated to a temperature which is as high as or slightly higher than the temperature of the mask sheet so that the latter will remain planar and substantially stress-free during operation and intolerable distortions will thus be avoided. A disadvantage resides in that frame heating gives rise to problems when the mask is to be changed, particularly if the mask sheet must be changed relatively often and in a short time, for instance, in production machines. In that case the mask frame must be heated quickly and must also be cooled quickly when the mask is to be removed. Besides, the dimensions of the mask will change in response to temperature changes in that case.

SUMMARY OF THE INVENTION

It is an object of the invention to provide an arrangement which is of the kind described first hereinbefore and in which a mask sheet which is substantially free of stress and distortion can be used in such a manner that the stresses in the mask sheet will remain within a permissible range even during operation so that a correct image of the structure of the permeable portion will reliably be generated on the substrate under the irradiation load. It is also to be ensured that even under an irradiation load within the predetermined tolerance limit the mask sheet will be maintained at the same temperature.

These objects are accomplished in a first aspect of the invention by providing a lithographic system including a source of radiation and a mask-exposure station, the source of radiation arranged to expose a mask at the station to a beam of radiation of substantial energy and a cooling surface disposed adjacent to the mask exposure station and surrounding the optical path of the beam, that cooling surface disposed in the field of view of the mask exposure station, whereby energy deposition on the mask by the beam can be compensated by thermal radiation from the mask to the cooling surface.

Preferably, the system includes a carrier arranged to hold lithographic masks in readiness to be moved to the exposure station, and temperature control means for maintaining the masks at substantially the temperature produced on a the mask at the mask-exposure station when exposed to the beam and exposed to the compensating action of the cooling surface. Preferably, the temperature control means comprises a temperature controlled wall adapted to face the masks for radiative cooling thereof and preferably, the masks are disposed in a chamber and the exposure station comprises an opening that is formed in the chamber wall, the opening disposed in the optical path.

In another aspect of the invention, the system of the invention includes a mask carrier disposed within a temperature-controlled chamber for positioning at least one mask, and a shutter arranged between the mask holder and the cooling surface and capable of blocking a mask in the carrier from the effects and the beam of the cooling surface. Preferably, the mask carrier comprises a mask-carrying wheel having its axis disposed outside the optical path or the mask carrier is a linearly displaceable member.

In yet another aspect of the invention, the cooling surface is disposed between the source of radiation and the mask-exposure station. Preferably, at least one covering surface adjoins the cooling surface at the top and terminates close to the radiation source.

In yet another aspect a cooling surface is disposed downstream of the mask-exposure station.

In another aspect two cooling surfaces are provided, one on each side of the mask-exposure station, and two shutters within the chamber, one disposed between the mask and each cooling surface. Preferably, a shutter is arranged to close in response to a failure of the radiation and/or cooling and preferably, a shutter comprises a rotatable member having an axis of rotation which is disposed outside the optical path or a the shutter comprises a linearly displaceable member.

In another aspect of the invention the cooling surface is in the general form of a surface or surfaces of revolution. Preferably, the cooling surface is defined by a metal tube-form cooling member which is concentric with the optical axis.

In yet another aspect of the invention the cooling surface surrounding the optical path is defined by grooves oriented to cause multiple reflection of heat rays from the mask to reduce the return of the rays to the mask. Preferably, the grooves comprise screw threads having inclined side faces and preferably, the cooling surface is coated with an absorption-promoting material. Preferably the material is graphite.

In yet another aspect of the invention a mask is provided, the surface of which that faces the cooling surface being coated with an emission promoting material. Preferably, the emission promoting material is carbon.

In another aspect of the invention, the distance from the cooling surface to the axis of the optical path exceeds the distance from the edge of the mask exposure station to the axis of the optical path.

In yet another aspect of the invention the source of radiation is an ion source and the mask is of the stencil type in which openings in the mask enable ions to pass through the mask in accordance with the form of the openings.

In accordance with the invention one or more cooling surfaces are provided between the mask and the radiation source and/or behind the mask, the surfaces surround the optical path and preferably consist of metal and are preferably spaced equal distances apart from the axis of the optical path, the distances from the cooling surfaces to the axis of the optical path exceed the distance from the edge of the mask sheet to the axis of the optical path, the mask is disposed in a space which is maintained by automatic control at a constant temperature, particularly at room temperature, by a heating of the walls, the mask sheet is movable in the chamber to extend in front of an opening that is formed in a chamber wall and disposed in the optical path, the opening is optionally formed in a shutter, which constitutes a part of the chamber wall, and radiant heat in a chamber which surrounds the mask will maintain the mask at room temperature or, as has been mentioned hereinbefore, at a higher temperature, if desired, so that it will not be necessary to heat (or cool) only the mask frame. By the radiant heat, the chamber temperature will determine the mask temperature so that the dimensional stability of the mask can be ensured even though the mask frame is not subjected to a temperature cycle.

In order to effect a radiation cooling which is as uniform as possible, the cooling surface may be constituted by a cooling tube, which is preferably concentric to the axis of the optical path.

The cooling action may be increased in that one or more additional cooling surfaces are provided on that side of the mask which faces away from the radiation source. The radiation cooling will predominate in the control of the temperature of the sheet. The radiation cooling is directly proportional to the emissivity $\xi$, the area of the sheet and the solid angle $\Omega$ under which the radiant heat from the mask can be incident on the cooled surface and the radiant cooling will change as $(T_M^4 - T_k^4)$, wherein $T_M$ is the temperature of the mask sheet and $T_k$ the temperature of the environment in kelvins and the temperature T in kelvins and the temperature t in degrees Centigrade are related as $T(K) = t(°C.) + 273.16$. The temperature of the sheet is determined by the power density I of the incident radiation, the emissivity $\xi$ of the sheet or of a coating on the sheet, and the ambient temperature.

In the region in which the mask is irradiated, the ambient temperature may be reduced by the cooling surfaces, e.g., by the cooling tube, to such an extent that the temperature of the mask when irradiated is increased by not more than the highest permissible value $\Delta T_{max}$ from the temperature of the room or room portion in which the mask is disposed before the irradiation. The material and the surface of the cooling tube should have such physical properties that the radiant heat which has been emitted by the mask sheet and is incident on the cooling tube is absorbed as completely as possible. The cooling elements should be so prefabricated that no radiant heat can reach the mask sheet from the outside, with the exception of the action of the radiation source. Besides, the material of the cooling tube should have a high thermal conductivity so that the absorbed heat can be dissipated. Moreover, in lithographic systems using electrons or ions, the material of the cooling tube must be electrically conducting so that a build-up of electric charges on the surface of the cooling tube will be prevented as such charges could establish fields which vary with time.

The inside surface of the cooling tube may desirably be formed with peripheral grooves, which are preferably constituted by screw threads, which preferably have inclined side faces, and the inside wall is optionally coated with an absorption-promoting material, preferably graphite. This will ensure optimum absorption properties of the cooling tube because the proportion of reflected heat radiation will strongly be decreased and a major part of the reflected portion will be redirected to the cooling tube and be absorbed there.

In order to prevent an influence of radiant heat which might be incident from the outside, one or more covering surfaces may be provided, which adjoin the cooling surface or cooling surfaces at the top and may terminate close to the radiation source, or covering surfaces which are symmetrical to the former may be provided for cooling surfaces disposed below the mask.

The emissivity of the mask sheet ma be increased in that those surfaces of the mask which face the cooling surfaces are coated with an emission promoting material, preferably carbon, so that the strongest possible radiation cooling of the mask sheet will be effected.

In accordance with a preferred further feature of the arrangement in accordance with the invention, the chamber in which the mask is movably disposed contains also other elements of lithographic set-up, such as mask changers and shutters for shutting off the radiation entirely or in part. Because the mask or masks is or are contained in the chamber, the mask or masks will be caused by the radiant heat to assume the temperature of the chamber wall.

In that chamber a mask can be moved by means of a mask changer without a change of the temperature and structural conditions of the mask sheet. A part of the chamber is disposed in the optical path of the lithographic set-up and one or more shutters are disposed in that portion of the chamber which is exposed to radiation. In a closed position the shutters constitute parts of the chamber wall. When the shutter is closed that surface of the shutter which faces the radiation source is exposed to the cooling tube at the same time so that the temperature of the shutter will not be changed if it consists of or is coated with a suitable material. When the shutter is closed, a mask can be moved quickly and in a simple manner to the exposing station of the chamber, i.e., to that portion of the chamber which is traversed by the radiation, and that movement can be effected, e.g., by a rotary mask changer. When the shutter disposed between the radiation source and the mask is then moved to its open position, the mask sheet will be irradiated in the region which is exposed by the shutter or through an aperture disposed over the shutter. That irradiated portion will also be exposed to the cooling elements. In dependence on the emissivity of the mask material, the incident radiant power and the temperature of the cooling elements, it is possible in accordance with the invention to establish such a balance of the effects of radiation and of cooling that the irradiated mask sheet will be at the same temperature as the mask sheet when it is not irradiated or that temperature will change only by a tolerable amount. As a result, the mask may permanently be exposed to radiation and cooling. The closing of the shutter will not result in a change of the temperature of the mask because the shutter will then act as a part of the chamber wall so that the mask can easily be moved from the exposure station and another mask can be moved to the exposure station, if desired. New masks can easily be moved out of and into the chamber because the entire mask consisting of a mask sheet and a mask frame carrying the sheet may be changed without a need for performing complicated mechanical operations as are required when the mask frame is heated.

Because the shutters and the like are disposed on the axis of the lithographic set-up at a location which differs from that of the mask, the compensation of the effects of radiation and cooling which can be achieved for the shutter by a change of the solid angle under which the cooling surfaces can be effective in conjunction with shutter and mask surfaces having given emissivities but cannot be optimized in conjunction with a corresponding compensation with respect to the mask sheet. This does not mean a disadvantage because much larger tolerances are permissible for the shutters then for the mask. The mask changer may comprise a mask carrier consisting of a mask wheel having an axis disposed outside the optical path. Alternatively, the mask changer may comprise a linearly displaceable mask carrier. The shutter for preventing an irradiation and/or cooling of the mask at an undesired time may be disposed between the cooling tube and the mask changer or between the upper housing part of the chamber and the mask changer and such shutter will be closed automatically in response to a failure of the radiation or cooling. That shutter may consist of a displaceable or rotatable member. The axis of rotation of a rotary shutter is disposed outside the optical path. By the use of that shutter it is ensured that in the absence of an irradiation load the temperature of the sheet will not be decreased by the cooling tube to such an extent that the mask sheet will be plastically deformed, in that case by an excessive cooling. When the mask sheet is exposed to radiation, it will be exposed to the cooling tube at the same time. If additional cooling surfaces are provided below the mask, another shutter may be provided, which is disposed between the mask and the additional cooling surfaces.

Whether the arrangement comprises or does not comprise cooling surfaces, the positioning of the image of the structure of the mask sheet on the substrate can be facilitated in that additional shutter is provided which may consist of a rotary member or of a linearly movable member. That shutter may be disposed within the chamber or may constitute a part of the chamber, e.g., a part of a chamber wall which is parallel to the mask sheet.

In a special embodiment of the invention, pairs of elongate openings may be provided, which extend in the direction of movement of the shutter and are spaced apart transversely to that direction, these pairs of openings succeed each other in the direction of movement of the shutter and are spaced apart in that direction, a preferably quadrangular opening is disposed between the elongate openings of each pair thereof so that the mask can selectively be exposed and covered, and each opening of one pair of said openings is disposed adjacent to an optical path which is associated with an alignment mark on the mark. Such an arrangement will ensure that the alignment marks of the mask will be irradiated in any position of the shutter, except for the action of supporting lands, because the alignment marks of the masks can permanently be irradiated through the elongate openings which extend in the direction of movement of the shutter. Owing to the opening provided between the two elongate openings, the substrate is exposed or is covered by the solid shutter portion which succeeds that opening in the direction of movement. In that case, the opening disposed between the elongate openings of each pair is shorter than each of the elongate openings of the pair and that edge of the opening which is transverse to the direction of movement of the shutter is optionally aligned with the end of the elongate openings. If the shutter is mounted for rotation about an axis and the pairs of elongate openings consist of radially spaced apart sectors of a circular ring which are concentric to the axis of rotation of the shutter, the preferably quadrangular opening may have two arcuate edges which are concentric to the axis of rotation of the shutter. In that case the shutter which is rotatable about an axis is continuously rotated about an axis disposed outside the optical path of the radiation source to move the opening defined by an arcuate segment over the active region of the mask. In a special further embodiment, the shutter may be formed with openings which succeed each other in the direction of movement of the shutter and have parallel edges extending in the direction of movement of the shutter and consecutive openings are separated from each other by a land which has a widened central portion for covering the optical path which is associated with the design area of the mask. The widened portion of the land may be formed with a window for the passage of the rays associated with the alignment marks on the mask. It will be understood that the alignment marks associated with the window can be used only as long as the shutter is in its predetermined position. For this reason the alignment marks associated with the windows are marks which are not used at all times and which in a concrete case will consist of marks for a correction of distortion. Because any distortion occurring in lithographic set-ups will not change within a short time, any correction of distortions need not be performed and checked continuously but it will be sufficient to perform and check such corrections once during a prolonged interval of time during the operation in which the mask is employed.

In dependence on the nature of the lithographic set-up which is employed, the alignment shutter may be disposed over and/or under the mask. The alignment shutter has such a mode of operation that the opened shutter will expose the entire active field and the alignment mark structures of the mask and the closed shutter will expose only the alignment mark structures whereas no images of the design structures will then be formed on the substrate.

An essential advantage that is afforded by the cooling arrangement in accordance with the invention resides in that the chamber and—owing to the radiation of heat from the chamber wall—the individual elements disposed in the chamber can be kept at a predetermined temperature and that temperature may be the room temperature or a slightly higher temperature, as is particularly preferred, so that an exchange of masks within the chamber can be effected quickly and without a problem. That advantage is of essential significance in all lithographic set-ups, particularly when the mask sheet must be exchanged quickly and relatively often, for instance, in production machines. Besides, other parts of the chamber are readily accessible so that masks can easily be changed from the mask wheel to the outside and from the outside inwardly.

It is apparent that the arrangement in accordance with the invention affords the advantage that the mask sheet will not be heated even under a relatively high irradiation load. As a result, the mask sheet will not undergo a temperature drop or rise under the irradiation load but will remain approximately at the chamber temperature, which may be the room temperature or a selected higher temperature. For this reason, distortions of the mask sheet caused by radiation will substantially be avoided. Such distortions may otherwise be induced by a cooling or heating of the mask sheet. The mask sheet will remain planar under the irradiation load.

The advantages mentioned hereinbefore cannot be obtained in a method in which a thermally pretensioned mask sheet is used in known manner or in which the mask is heated by its frame because in that case the mask must be thermally pretensioned or the mask frame must be heated before any irradiation loading and that pretensioning or heating will involve a substantial expenditure and technical complications.

Another important advantage of the arrangement in accordance with the invention resides in that the mask sheet need only be pretensioned to have a planar shape and to eliminate any sag, as the mask sheet is not subjected to a radiation-induced temperature loading which would decrease the tension level.

From the theoretical paper by J. N. Randall et al, Nat. Res. Soc. Symp. Proc., vol. 76, pages 73 to 77 (1987) it is apparent, e.g., that in a Si mask sheet having an area of 50mm×50mm an initial tension of $2 \times 10^7$ N/m$^3$ will result in production-induced distortions below 0,5 μm when design structures are etched into the sheet. Such a silicon mask sheet with such tolerable distortions can be used in the process in accordance with the invention.

Theoretical model calculations relating to a specific mask configuration, which is often used in practice, have shown that the mask temperature $t_M$ in ° C. depends very highly on emissivity and on the incident radiant power I.

DESCRIPTION OF THE PREFERRED EMBODIMENT

BRIEF DESCRIPTION OF THE FIGURES

The invention will now be explained by way of example with reference to the drawing.

FIGS. 1 and 2 show by way of example the dependence of the mask temperature $t_M$ on the temperature $T_{K1}$ under the radiant power I which is present above the mask or is incident on the mask from above.

FIGS. 7a and 7b show the possibility of effecting a chipwise exposure through the design structures of the mask. The associated registration marks may be provided on the wafer substrate in the scored valleys between the chip areas.

FIG. 10b is a blown up view of the mask region and ion column of the embodiment in FIG. 10a.

Figure 1:
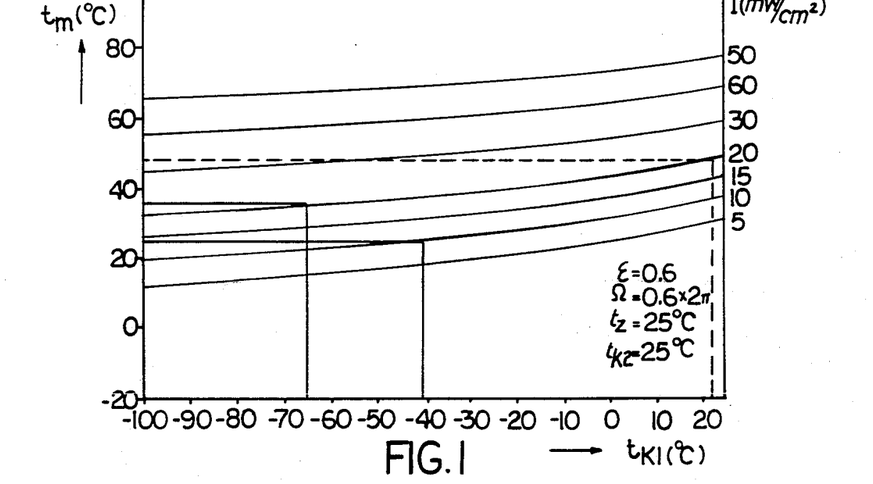
Figure 2:
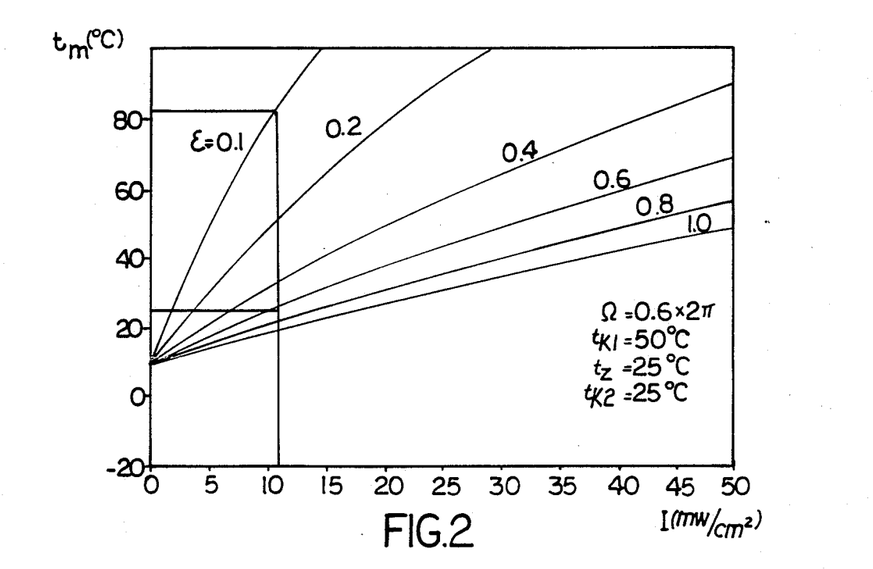
In FIG. 2 shows the mask temperature $t_M$ plotted against the radiant power I for $t_{K1} = -50°$ C., $t_{K2} = t_Z = 25°$, $\xi = 0,6$ and $\Omega = 0,6 \times 2\pi$.

FIGS. 1 and 2 show by way of example the dependence of the mask temperature $t_M$ on the temperature $T_{K1}$ under the radiant power I which is present above the mask or is incident on the mask from above. It has been assumed that the cooling surface K2 under the mask is at a temperature $t_{K2} = 25°$ C. It is apparent from FIG. 1 that in case of an emissivity $\xi = 0,6$ and a mean solid angle $\Omega = 0,6 \times 2\pi$ and an incident radiant power I = 10 mW/cm$^2$ the mask must be cooled by a cooling tube K1 which is at a temperature $t_{K1}$ of about $-40°$ C. to maintain the mask at an assumed room temperature $t_2 = 25°$ C.

In case of higher radiant powers it will be useful to heat the chamber so as to heat the mask to a somewhat higher temperature $t_M = 35°$ C., for instance, so that a cooling temperature $t_{K1} = -65°$ C. will be required if the parameter values $\xi = 0,6$ and $\Omega = 0,6 \times 2\pi$ are selected and the mask sheet is irradiated with I = 20 mW/cm$^2$.

If a radiation cooling using $t_{K1} = -65°$ C. was not adopted but $t_{K1} = t_{K2} = t_Z = 25°$, the mask under a load of 20 mW/cm$^2$ would be heated to a temperature of about 50° C. so that temperature-induced distortions may occur and the mask structures may be stress-relieved and may sag in mask sheets under low stress.

In FIG. 2 the mask temperature $t_M$ is plotted against the radiant power I for $t_{K1} = -50°$ C., $t_{K2} = t_Z = 25°$, $\xi = 0,6$ and $\Omega = 0,6 \times 2\pi$. From the results it is apparent that in case of a load of 11 mW/cm$^2$ and a radiation cooling using $t_{K1} = -50°$ C. a mask having an emissivity $\xi = 0,6$ will remain at room temperature $t_Z = 25°$ C. and that the mask temperature will rise up to about 80° C. if a different material having an emissivity $\xi = 0,1$ is used. An emissivity $\xi = 0,6$ is applicable to silicon surfaces. $\xi = 0,1$ is typical of metal surfaces. For this reason metal masks are desirably coated with a material such as graphite.

Figure 3:
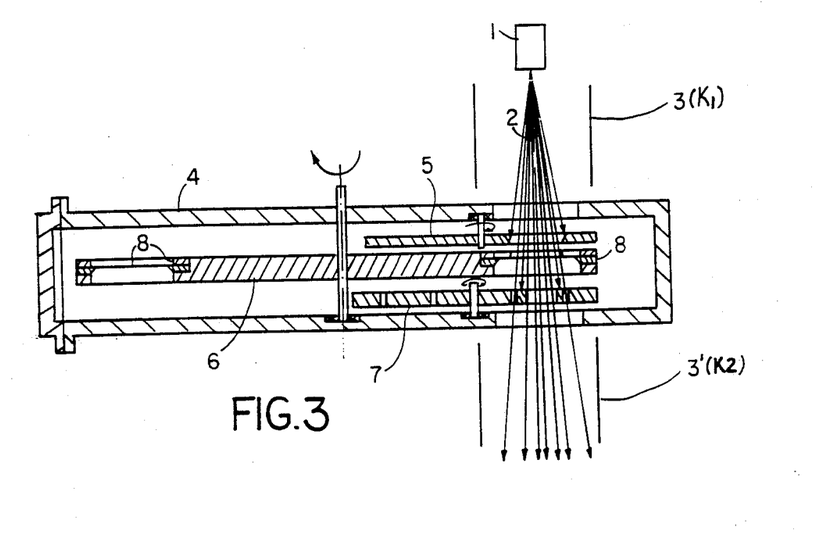
FIG. 3 shows diagrammatically the arrangement of a cooling tube and of a mask that is irradiated from an ion source as well as a shutter.
Figure 4:
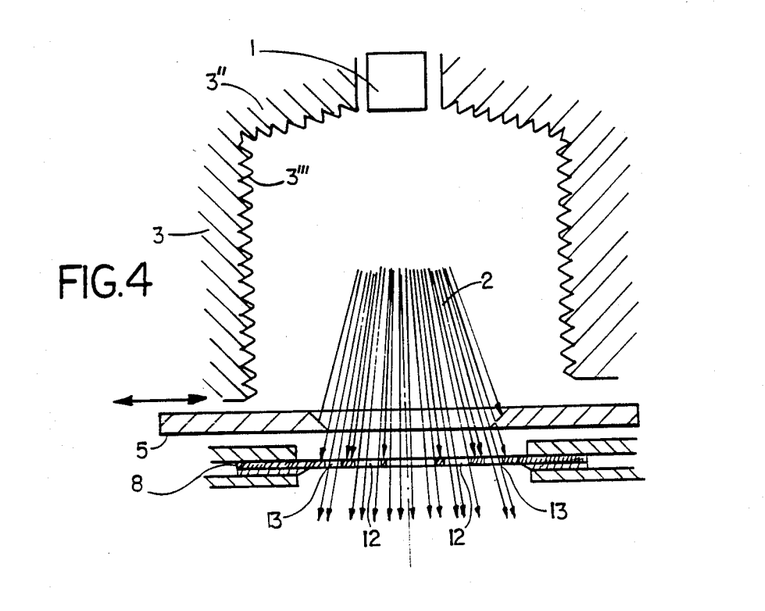
FIG. 4 is a diagrammative view showing the upper portion of an ion-projecting lithographic set-up that is designed in accordance with the invention without the succeeding ion-optical lens system.

Referring now to FIGS. 3 and 4 an ion-projecting lithographic set-up comprises a radiation source and has an optical path 2 extending through a chamber 4, which contains a mask changer 6, a rotary shutter 7 and a shutter 5, which automatically closes in response to a failure of the beam. The shutters may alternatively be arranged for a translational movement.

A cooling tube 3 (K1) is disposed between the chamber 4 and the radiation source 1 and surrounds the optical path and is coaxial to the optical axis of the set-up. As the cooling tube is larger in diameter than the mask sheet, the cooling tube is not disposed in the optical path of the radiation source 1. Another cooling tube (K2) is indicated at 3'.

In order to minimize the influence of the ambient temperature on the interior of the cooling tube, an additional cooling element which has covering surfaces 3" is preferably attached to the cooling tube in such a manner that the cooling element has a certain inclination relative to the cooling tube and terminates close to the radiation source so that the distance between the radiation source and the cooling tube will be minimized. The inside surface of the cooling tube 3 is formed with grooves, which in the embodiment shown by way of example consist of screw threads 3''' having grooves which are triangular in cross-section. The inclination of the oblique side faces of the screw threads is so selected that the conditions for multiple reflections are met so that the heat rays emitted by the mask 8 as well as the heat ray which is incident from the environment will not be reflected back to the mask 8 but owing to the rough and absorbent inside surface can be returned to the cooling tube by diffuse reflection and are eventually absorbed entirely.

Figure 5:
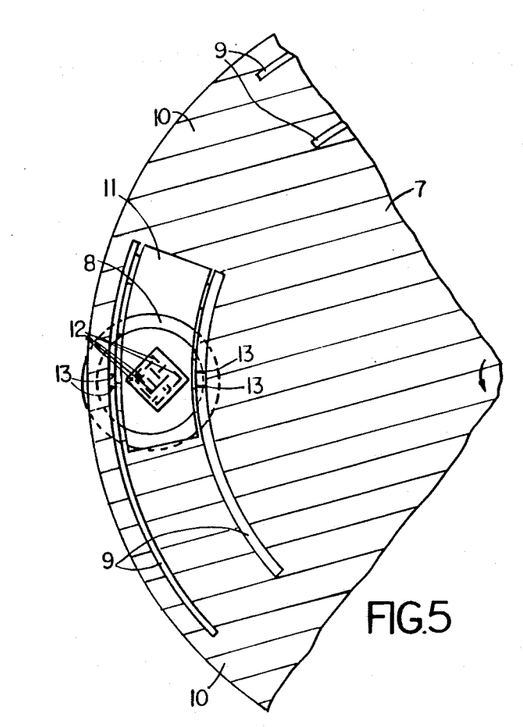
FIG. 5 is a fragmentary view showing a portion of a rotary shutter in accordance with the invention viewed in the direction toward the mask and the radiation source.

In a preferred embodiment a portion of a shutter 7 which rotates about an axis that is disposed outside the optical path 2 is shown on a enlarged scale in FIG. 5 and has two concentric, elongate openings 9, which mainly consist of continuous openings having the configuration of a sector of a ring. The ring disposed between the two openings 9 is connected by supporting lands 10 to the carrying disc of the shutter 7. That ring sector which is disposed between the two ring sector-shaped openings 9 is formed with an opening 11. Adjacent openings 9 are sufficiently spaced apart so that the solid portions of the ring disposed between the openings 9 will be able to cover the active area 12 of the mask 8.

The elongate openings 9 are so arranged that they will always lie above the alignment marks 13 of the mask 8. Because the ring sector-shaped openings 9 are continuous with the exception of the narrow supporting lands 10, the alignment marks 13 of the mask 8 will substantially permanently be irradiated so that a highly exact alignment of the mask with the structure to be shaped will be enabled even when the substrate is not irradiated through the design structures 12 of the mask 8. Owing to the solid portions provided between the openings 11 in the ring between the two elongate openings 9, the active area 12 of the mask 8 can be covered or can be irradiated as required if the shutter 7 is pivotally moved to a position in which an opening 11 exposes the entire active area 12 of the mask 8. As has been mentioned hereinbefore, the alignment marks 13 of the mask 8 will lie within the irradiated area in any position which can be assumed by the shutter 7 so that the exact adjustment of the mask relative to the structure to be machined can be checked at any time and the projected area can be aligned with the substrate even during the exposure through the design structure.

Alignment processes which are suitable for use in ion-projecting lithographic set-ups have been described in detail in patent applications (Austria No. A 1314/86, EP-87890.10-2.4, U.S. patent application Ser. No. 07/056,598, Japan No. 62-118733 and Austria No. A 1404/87).

Figure 7A:
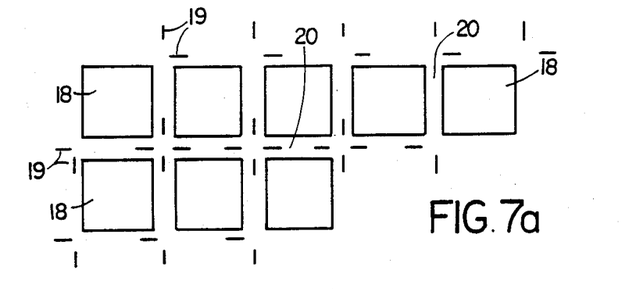
FIG. 7a illustrates the use of a mask having four alignment openings and of a shutter as shown in FIG. 5.

If the alignment structures of the mask are arranged as shown in FIG. 5, the projected ion image can be aligned by movements in the X and Y directions and by a rotation and by a change of scale. Chip areas 18 on the substrate may be exposed through design structures 12 in such a manner that the test rays which correspond to alignment structures of the mask are directed to registration marks 19 on the substrate. Such registration marks may be disposed in scored valleys 20 between the chip areas 18, as is apparent from FIG. 7a. For this reason, very long registration marks and alignment test rays of corresponding length can be used; this is of high importance for the accuracy and speed of the aligning operation. Because the alignment openings of the mask are disposed at the edge of the field which is irradiated by the ions on the mask 8, the test rays for aligning and the registration marks are spaced apart as far as possible; this is highly desirable for the precise adjustment of the angular position and of the scale.

Figure 6:
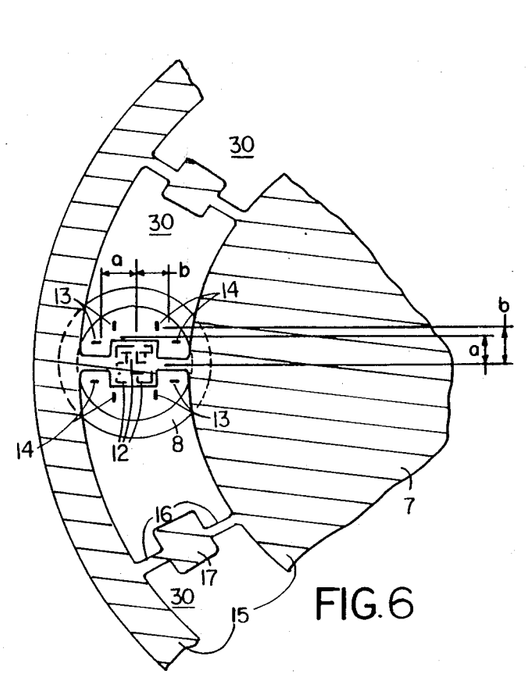
FIG. 6 shows an alignment shutter in a modification of FIG. 5.
Figure 7B:
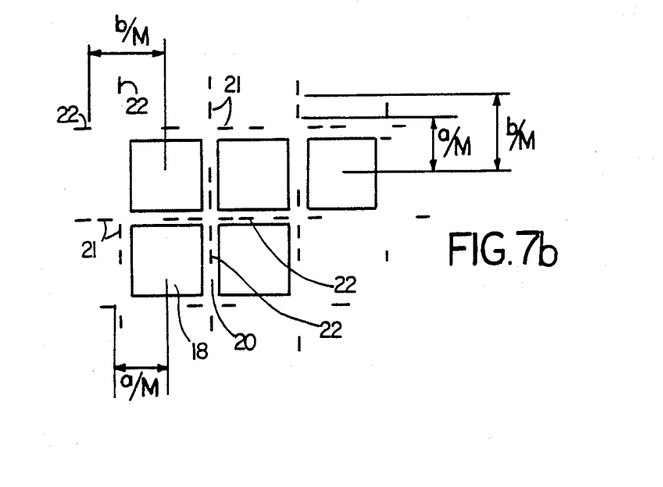
FIG. 7b illustrates the same case as FIG. 6, where as much as eight beams corresponding to the alignment mark openings are used together with corresponding registration marks on the wafer.

The invention permits also the use of masks having more than four alignment marks or alignment structures. An example of an arrangement for eight alignment structures is shown in FIG. 6 together with a suitable alignment shutter, which in the concrete example is rotatable. In that example the alignment openings 13 of the mask 8 are spaced a distance a from the center of the mask 8 and the alignment openings 14 are spaced a distance b in the x and y directions. In the position shown in FIG. 6 a widened portion 17 of supporting lands 16 of the shutter covers the design area 12 of the mask 8 and the areas of the alignment openings remain exposed. The test rays can be directed to the registration marks 21 and 22, which are shown in FIG. 7b and disposed in the scored valleys 20. The registration marks are spaced by the distances a/M and b/m from the centers of the chip areas (projection design structures), where M is the reproduction scale of the lithographic set-up. As a result, the projected ion image can be aligned by a movement in the X and Y directions and by a rotation and change of scale and it is also possible to detect particularly anamorphistic distortions, e.g., trapezoidal and rhombohedral distortions, of the projected ion image. For instance, an anamorphistic distortion may be caused due to the fact that the reproduction scales in the X and Y directions are different. In that case it will be sufficient for a detection of that difference between $M_x$ and $M_y$ to provide a fifth alignment test ray or beamlet and a corresponding registration mark on the substrate. The image distortions which have thus been detected may be electronically corrected in ion-projecting systems, as has been set forth in patent applications. (Austria No. A 3,313/85, EP 87890020.8, U.S. patent application Ser. No. 009414 (now U.S. Pat. No.

4,859,857), Japan No. 62/21643 for images on a reduced scale and Austria No. A 3173/86 for shadow projection).

When the alignment has been effected, the alignment shutter 15 is moved to a position for an exposure of the chip through the structures of the design area 12. As the aligning operation is interrupted only for a short time by the movement of the shutter, the alignment of the projected ion image with the registration marks on the wafer can be maintained almost throughout the exposure of the chip.

Figure 8:
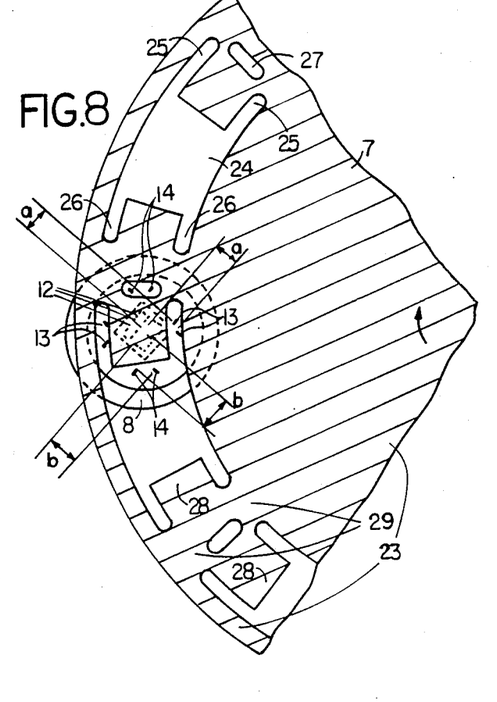
FIG. 8 shows a particularly preferred embodiment of a shutter.

In the embodiment shown in FIG. 8 the shutter is formed with openings 24 which succeed each other in the direction of the rotary movement of the shutter and which have parallel edges extending in the direction of movement of the shutter. Adjacent openings 24 are separated by a land 29, which has a widened central portion 28. The widened portion 28 is adapted to cover the optical path which is associated with the design field 12 of the mask 8.

In accordance with FIG. 8, the widened portion 28 of the land 29 is formed with a window 27, which permits the passage of the optical path which is associated with the alignment marks 14 on the mask 8. That part of the widened portion 28 of the land 29 which is disposed between the window 27 and the opening 24 of the shutter 7 is adapted to cover the optical path which is associated with the design area 12 of the mask. The shutter 8 shown in FIG. 8 constitutes an optimum design and permits the correct relative position of the wafer and the mask to be adjusted with the aid of eight rays before the chip is exposed. A total of eight rays and eight optical paths may be used so that the desired alignment can be effected by movements in the X and Y directions, by a rotary movement and by a change of scale and distortions of the projected image can be detected. Such distortions may be due to the fact that the scales in the X and Y directions are different. Such an anamorphism may be eliminated by a proper control of ion-optical correcting elements which surround the optical path. As is apparent from FIG. 8 the structures 13 will lie within the opening 24 even when the design area 12 of the mask is covered by the widened portion 28 of the land 29 so that it will always be possible to check whether the rays from the marks 13 of the mask are incident on the marks 21 on the wafer, i.e., whether images of the marks 13 are actually formed by the test rays on the marks 21 of the wafer. The rays which are associated with the marks 14 of the mask can pass through the window 27. Whereas said rays are interrupted by the movement of the shutter so that the aligning operation is interrupted during the exposure of the chip, that fact will not be disturbing because those test rays are used for a control of distortions, e.g., for the elimination of any anamorphism, and it is sufficient to make that correction from time to time.

Figure 9:
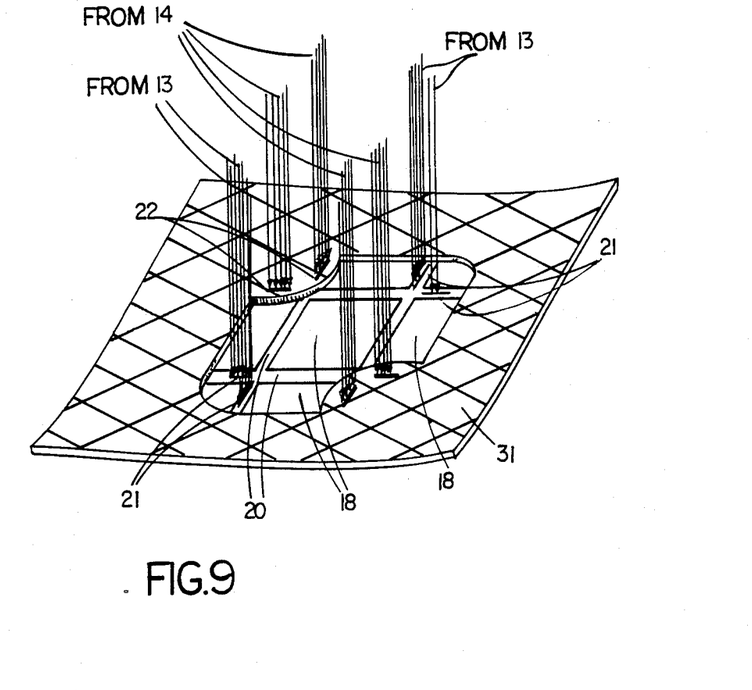
FIG. 9 is a perspective view showing a reference plate.

In accordance with FIG. 7b all reference marks are provided on the wafer itself and may directly be associated with the marks on the wafer by eight rays. But such association is not essentially required, as is apparent from FIG. 9, which shows that images of marks 14 of the mask may be formed by means of ion test rays on marks 22 which are provided on a reference plate 31 rather than on the wafer. The other marks 21 are provided on the wafer in the scored valleys. For this reason the reference plate 31 may be used to define a plane, with the aid of which the projected ion image can be so stably positioned in three dimensions by movements in the X and Y directions, by a rotary movement and by a change of scale that the reference to the wafer can be established from that plane. In that case it will be possible, for instance, to make exposures even when the wafer has not been provided with marks 21 before. For instance, if the first wafers which are exposed in the lithographic set-up through marks structures have not been provided with the registration marks before, the alignment rays associated with the mask structures 14 may be caused to register with the structures on the reference plate 31 to provide a three-dimensionally stable system for the projected ion image. It will then be possible to expose the wafer in exactly positioned chip areas if the table disposed under the reference plate is properly moved and a laser interferometer, for instance, is used to check the position of the table relative to the reference plate.

Figure 10A:
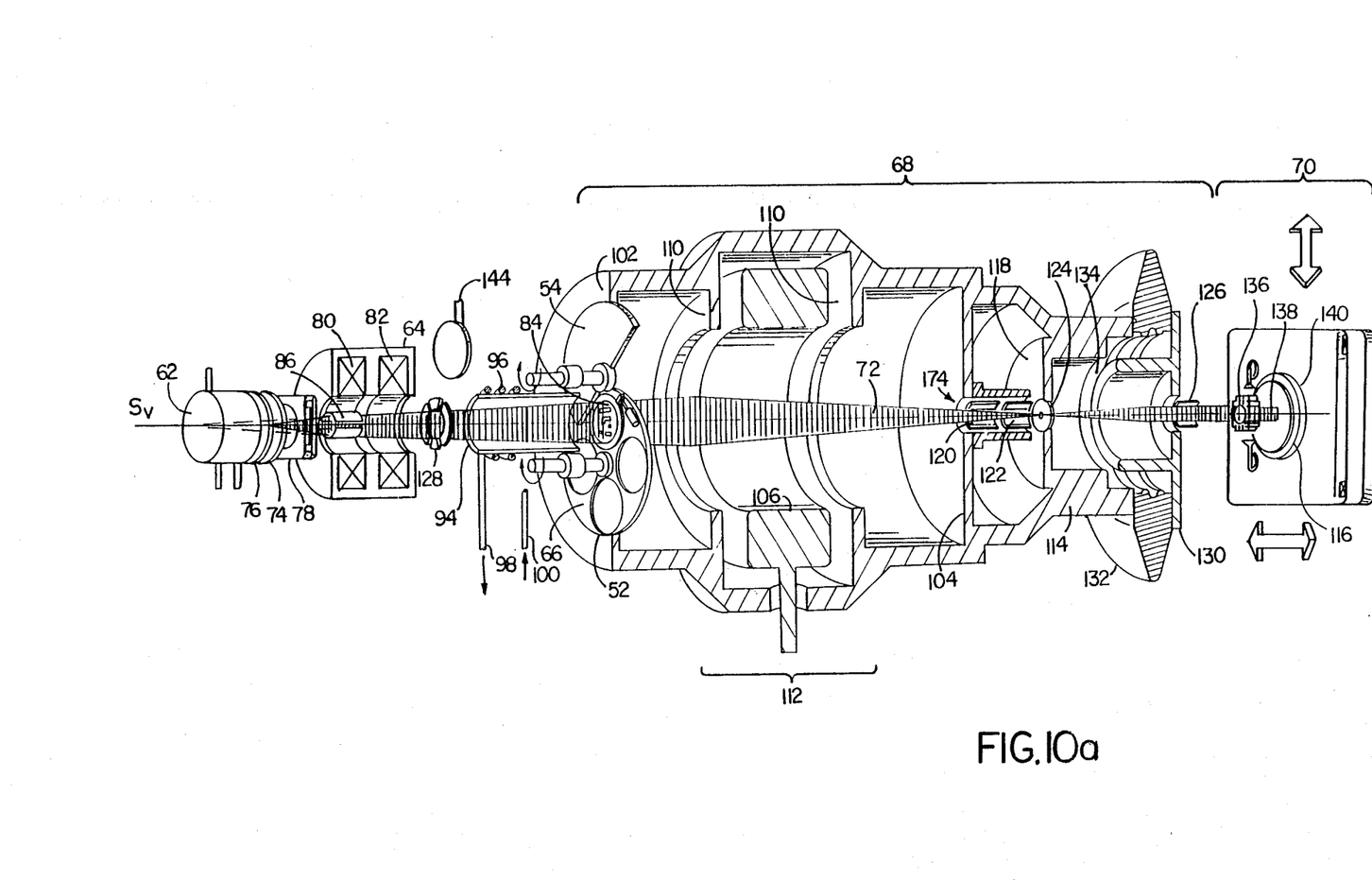
FIG. 10a is a three-dimensional cutaway view of a preferred embodiment ion beam apparatus employing mask stabilizing according to the invention.

Referring to the three-dimensional cut away view in FIG. 10a, a preferred embodiment of an ion projection lithography machine is provided. The main components are, in sequence, the ion source 62, solenoid 64, mask assembly 66, the optical column 68 and the target chamber 70. Ions are produced from the ion source 62, and pass through a double coil solenoid 64 that serves to analyze the beam 72, to separate the required ion specie, in this preferred embodiment helium, from other beam ion species issued from the ion source. The source includes an extractor plate 74 at a negative potential with respect to the ion source for accelerating ions produced in the source and a supressor plate 76 also at negative potential with respect to the source for applying an additional voltage for repelling electrons and thereby prohibiting their entrance to the optical column. Following the extractor plate 74, an ion source X, Y alignment stage 78 is provided which allows sliding movement of the entire source for proper alignment with respect to the axis of column 68. The two coils 80, 82 of the solenoid 64 are oppositely wound to provide counter rotating magnetic excitation which acts upon the ions to prevent the beam from being rotated about its axis as a result of passage through the solenoid. The solenoid also reduces the angle at which the beam strikes the mask assembly 66; by thus reducing the solid angle of the ion beam, a greater flux may impinge upon the mask 84 and enter the column through its aperture. This reduction in angle is also important because the mask has thickness and the channels in it are very narrow; reduction in the angle of incidence minimizes the amount of shadowing that can occur due to the mask thickness. Within the first winding 80 of the solenoid an electrical shutter 86 comprised of a multipole array is provided to act as an electrical shutter to deflect the beam from the column axis using dipole fields. This multipole may also apply quadrupole fields to adjust the magnification at the source beam in the X and Y directions (in the plane perpendicular to the beam axis) and thereby correct for elliptical distortions in the source.

Also provided in this region is vacuum isolation valve 144 which allows the optical column 68 to be sealed from the source during source replacement or repair. A dose monitor 128 is positioned beyond the solenoid. The outer periphery of the beam impinges upon a known area of the monitor 128 and the induced current is measured. In this way the flux of the beam through the column may be deduced and the exposure time required for a given resist determined.

Figure 10B:
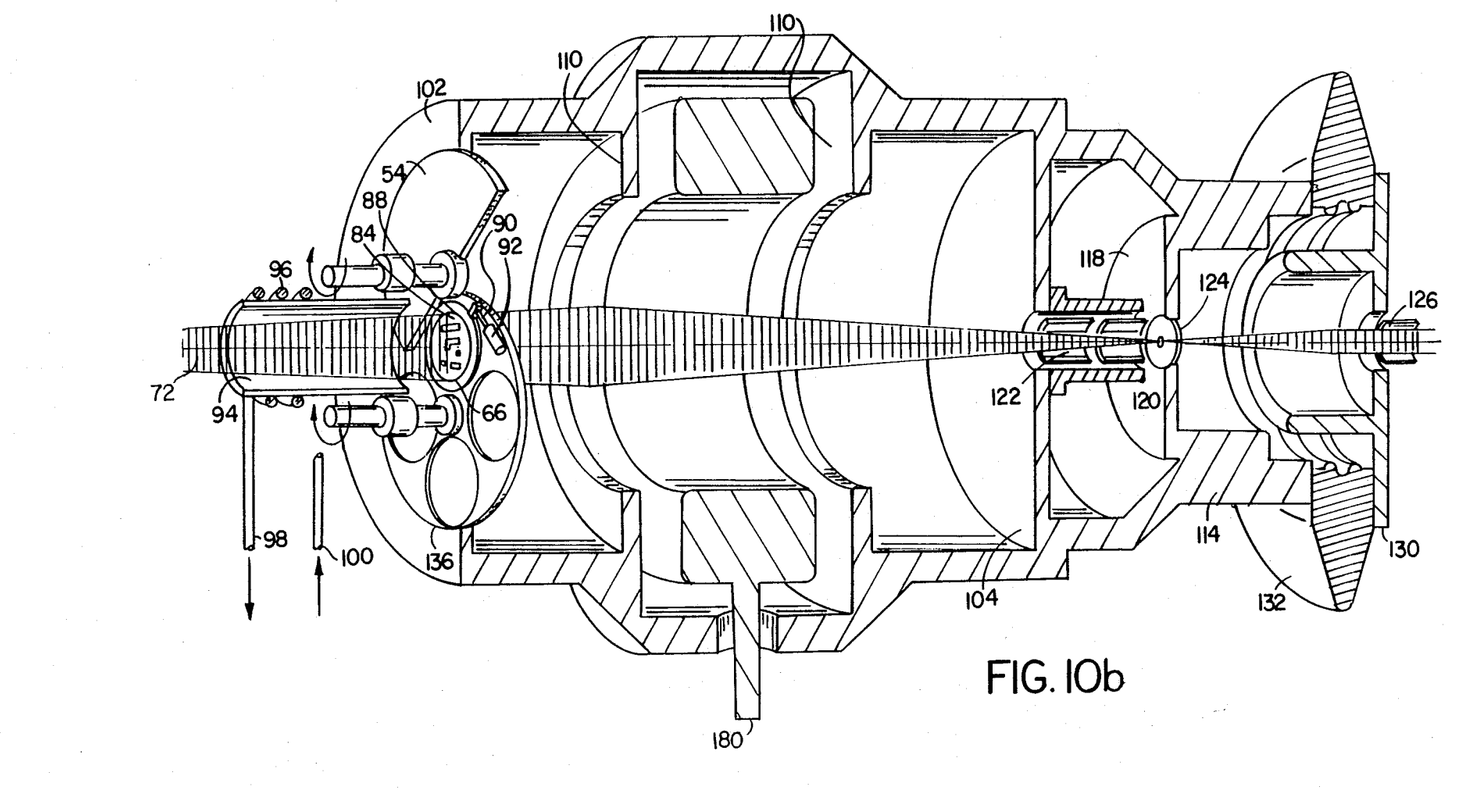

Following the dose monitor 78, the beam continues on to the mask assembly 66 which is shown in FIG. 10a and most illustrated in a larger scale view in FIG. 10b. The mask assembly 66 includes a complementary set of masks 84 on a rotating disk, one of which is shown. Each mask is mounted on a flexure mount 88 which permits rotation of the die pattern in response to signals produced by linear motion of the pusher rod 90 driven by a piezo electric transducer 92. The rotation of the mask 84 and hence rotation of the die pattern on the order of ±500 microradians is controlled in response to a beam alignment system described below. Preceeding the mask assembly 66 is exposure shutter 54 (see FIG. 10c) and a mask cooling cylinder 94. The cylinder 94 which extends about the beam axis and is cooled by refrigerant circulating through concentric coils 96, radiatively cools the mask. When the shutter 54 is positioned to block the beam from a mask, it simultaneously blocks the radiative cooling effects of the cylinder 94.

Figure 10C:
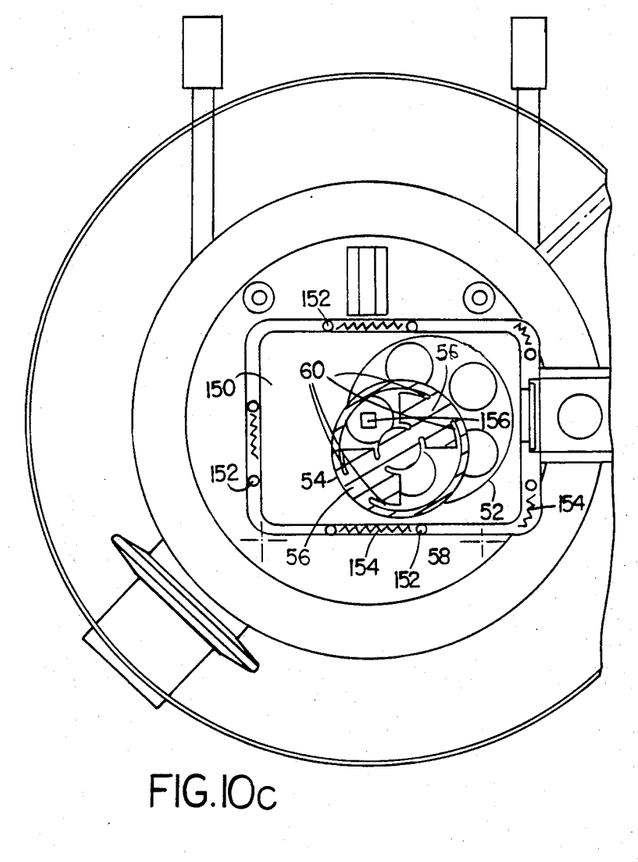
FIG. 10c is a view of the mask carousel and beam shutter of the embodiment of FIGS. 10a and 10b.

Referring now to FIG. 10c, there is shown a cutaway view along the ion optical axis of a rotary shutter assembly 54 and a mask carousel 52 which is positioned before the ion optical lens system of FIGS. 10a and 10b and allows passage of eight alignment beamlets. (The shutter is shown only diagrammatically in FIG. 10a. Similarly, the shutters of FIGS. 5, 6 or 8 might be employed). The mask carousel 52 and shutter 54 may be held in a chamber 150 (shown in cutaway), the temperature of which may be controlled by the application of cooling through cooling coils 156 and heating through heating elements 154. The temperature controlled chamber allows maintaining the masks in the carousel not exposed to the beam at an optimal constant temperature.

The carousel in this embodiment holds for example, four complementary masks that make up an entire pattern plus one metrology mask that is put in position in a metrology mode to measure machine distortion. The carousel rotates so that a mask comes into the axis of the column 156. When in position on the column a separate mechanism (not shown) clamps the mask to the back wall of the first lens. Opposite the position of the mask, there may be a vacuum lock chamber holding other masks and a mechanism that loads and unloads the masks from this carousel (not shown). Once a set of masks is unloaded then a vacuum well is used to isolate that set from the main chamber and that set can be removed and replaced with another set.

The rotating mechanical shutter 54 is used to control the exposure time. There are two shutter positions 56 which cover the mask and prevent exposure and two shutter positions 58 where the mask is fully exposed. In the exposed positions, the mask is subject simultaneously to the heating effects of the beam and the cooling effects of the cooling cylinder and is thereby maintained at the optimal constant temperature of the chamber. In the shutter position preventing exposure, the shutter simultaneously blocks the mask from the effects of both radiation and cooling element. Both the mask and shutter thereby maintain the optimal chamber temperature as discussed above herein.

Arcuate slots 60 in the shutter 54 are shown in FIG. 10c. These allow the beam alignment function to occur without exposing the central die field of the mask. For example, just prior to exposure of the die field the shutter can be positioned such that three pairs of alignment marks in the mask are exposed to the beam through the slots. This is sufficient to determine five alignment parameters: X and Y translation in the wafer plane, rotation $\theta$ and magnification $M_X$ and $M_Y$ with the resulting signals from the detectors and the sixth reference beam or beamlet being used to provide an error signal as a measure of the accuracy of the other beamlet signals. Once these parameters are established, exposure may begin. At some point during the exposure, during rotation of the shutter, one of the pairs is interchanged for another pair of alignment marks so that when the exposure is terminated the alignment has been retained right through exposure. The exposure shutter may likewise be used in coordination with an electrical shutter positioned, for example, between the source and the mask for the purpose of deflecting the beam from the mask between exposures.

Continuing to refer to FIGS. 10a and 10b, the beam, with its angle slightly modified by the solenoid passes through the mask 84 and enters a large diameter accelerating Einzel lens 112. The Einzel lens, as is known, is a three electrode lens. In this embodiment, the first electrode 102 and third electrode 104 are integrally formed from the column envelope, a rigid metal shell, and are at equal potential. The second, or middle electrode 106 is at a different, ion accelerating potential. A pair of field control apertures 110 are formed on either side of the middle electrode 105 to truncate its electrical field and thereby avoid distortion affects such fields are know to cause.

The beam trajectory is changed by the Einzel lens so that it converges and forms a crossover or an image of the ion source between the Einzel lens 112 and a second, gap lens 114 which in turn is used to accelerate the ions and form an image of the mask on the target 116. As is well known, a gap lens is a two electrode lens having first and second electrodes at a potential difference. In this case the first electrode 118 of gap lens 114 is an integral portion of the rigid shell and the second electrode 130 is supported by insulator bushing 132 at the end of the rigid shell. As suggested by the beam trajectory, which is shown schematically, the gap lens 114 forms beams of ions travelling substantially parallel to the axis of the column, with cross-section forming an image of the mask as it strikes the wafer. A system of this type is termed to be telecentric.

Near the position where the Einzel lens 112 forms a crossover of the ion beam, there is multipole assembly 174, preferably consisting of two successive multipoles 120, and 122 which, by application of suitable dipole fields alter the beam position in the X, Y plane (i.e., the target plane). By application of dipole fields equal in magnitude but opposite in sign to the two multipoles the beam may be offset from its original path, but remain parallel to it. The magnitude of these deflections are controlled by the beam alignment system in response to signals generated from the alignment beams and may be for example, $+/-5$ microns. The multipoles are preferably an array of 16 curved arcs which more closely approximate a cylindrical surface than conventional rods and may be used to generate any even powered fields (e.g. dipole, quadrupole, octupole etc.) up to a 16 pole field. In the practice of the preferred embodiment, the higher order fields are preset to correct for system distortions while the dipole fields for the deflection are superimposed.

The multipole assembly 174 is closely followed by the mass selection aperture 124 which in conjunction with the solenoid serves to select ions of only the desired mass for imaging onto the wafer. In a field free region, downstream from the aperture 124 and the gap lens 114, a multipole assembly 126 for generating quadrupole fields is provided for altering the relative magnification of the image in the X ($M_x$) and in the Y ($M_y$) direction in the wafer plane in opposition to each other. For example, if the magnification in the X direction is made smaller, then the magnification in the y-direction is larger. This element, therefore, is used to make fine adjustments to the magnification difference between X and Y to compensate for errors such as slight tilting of the wafer in the image plane. For absolute adjustment of the magnification the main lens voltages are used as described later herein. In the embodiment in FIG. 10a, the quadrupole assembly 126 is an array of 16 curved arcs and is controlled by a beam alignment system in response to signals generated by back-scattered electrons at the alignment ring or wafer for making changes in the $M_x$ and $M_y$ by a factor of approximately $\pm 5 \times 10^{-4}$.

In this embodiment, just before the beam strikes the wafer, there is located the alignment beam scanner and detector system 136 which is used to monitor the position of the image formed on the wafer and produce signals to induce correcting action of the optical elements to the extent a misalignment is detected.

Whereas the shutters shown in FIGS. 5, 6, 8, 10a–10c are rotatable, they may analogously be designed as shutters for a linear movement.

The use of the concrete shutter arrangements and methods of operation illustrated in FIGS. 5, 6, 8 and 10a–10c is not restricted to ion-projecting systems but they may analogously be used with lithographic set-ups of optical, X-ray and electronic type.

What is claimed is:

1. A lithographic system including a source of radiation and a mask-exposure station, the source of radiation arranged to expose a mask at said station to a beam of radiation of substantial energy and a cooling surface disposed adjacent to the mask exposure station and surrounding the optical path of said beam, said cooling surface being at a temperature below the temperature of said mask and disposed in the field of view of the mask exposure station, whereby energy deposition on said mask by said beam can be compensated by thermal radiation from said mask to said cooling surface.

2. The system of claim 1 including a carrier arranged to hold lithographic masks in readiness to be moved to said exposure station, and temperature control means for maintaining said masks at substantially the temperature produced on a said mask at said mask-exposure station when exposed to said beam and exposed to the compensating action of said cooling surface.

3. The system of claim 2 wherein said temperature control means comprises a temperature controlled wall adapted to face said masks for radiative cooling thereof.

4. The system of claim 2 or 3 wherein said masks are disposed in a chamber and said exposure station comprises an opening that is formed in the chamber wall, said opening disposed in the optical path.

5. The system of claim 1 including a mask carrier disposed within a temperature-controlled chamber for positioning at least one mask, and a shutter arranged between the mask holder and said cooling surface and capable of blocking a mask in said carrier from the effects of said beam and said cooling surface.

6. The system of claim 2 or 5, wherein the mask carrier comprises a mask-carrying wheel having its axis disposed outside the optical path.

7. The system of claim 2 or 5, wherein said mask carrier is a linearly displaceable member.

8. The system of claim 1 wherein a said cooling surface is disposed between said source of radiation and said mask-exposure station.

9. The system of claim 8 further comprising at least one covering surface which adjoins said cooling surface at the top and terminates close to the radiation source.

10. The system of claim 1, 8 or 9 wherein a said cooling surface is disposed downstream of said mask-exposure station.

11. The system of claim 5 having two cooling surfaces, one on each side of said mask-exposure station, and two shutters within said chamber, one disposed between the mask and each cooling surface.

12. The system of claims 5 or 11 comprising means for closing said shutter in response to a failure of the radiation and/or cooling.

13. The system of claims 5 or 11 wherein a said shutter comprises a rotatable member having an axis of rotation which is disposed outside the optical path.

14. The system of claims 5 or 11 wherein a said shutter comprises a linearly displaceable member.

15. The system of claim 1 wherein said cooling surface is in the general form of a surface or surfaces of revolution.

16. The system of claim 15 wherein said cooling surface is defined by a metal tube-form cooling member which is concentric with the optic axis.

17. The system of claim 1, 15 or 16, wherein the cooling surface surrounding the optical path is defined by grooves oriented to cause multiple reflection of heat rays from the mask to reduce the return of said rays to said mask.

18. The system of claim 17 wherein said grooves comprise screw threads having inclined side faces.

19. The system of claim 18 wherein said cooling surface is coated with an absorption-promoting material.

20. The system of claim 19 wherein said material is graphite.

21. The system of claim 1 including a mask the surface of which that faces the cooling surface being coated with an emission-promoting material.

22. The system of claim 21 wherein said emission promoting material is carbon.

23. The system of claim 1 wherein the distance from said cooling surface to the axis of the optical path exceeds the distance from the edge of the mask exposure station to the axis of the optical path.

24. The system of claim 1 wherein said source of radiation is an ion source and said mask is of the stencil type in which openings in said mask enable ions to pass through said mask in accordance with the form of the openings.

25. The system of claim 1 wherein said mask is disposed in a chamber and said exposure station comprises an opening that is formed in the chamber wall, said opening disposed in the optical path.

26. The system of claim 1 including a shutter arranged between said mask holder and said cooling surface being capable of blocking said mask from the effects of said beam and said cooling surface.

* * * * *

UNITED STATES PATENT AND TRADEMARK OFFICE
CERTIFICATE OF CORRECTION

PATENT NO. : 4,916,322

DATED : April 10, 1990

INVENTOR(S) : Hilton F. Glavish, et al.

It is certified that error appears in the above-identified patent and that said Letters Patent is hereby corrected as shown below:

On the title page
In Assignees: change "Osterreichische" to --Oesterreichische--;

Col. 3, line 13 and 14; insert "-" between --emission promoting--;

Col. 4, line 40; "ma" should be --may--;

Col. 4, line 42; insert "-" between --emission promoting--;

Col. 13, line 7; insert "-" between --piezo electric--;

Col. 15, line 4, insert "-" between --X direction--.

Signed and Sealed this

Seventeenth Day of December, 1991

Attest:

HARRY F. MANBECK, JR.

*Attesting Officer*   *Commissioner of Patents and Trademarks*